(12) United States Patent
Kim et al.

(10) Patent No.: US 7,379,355 B2
(45) Date of Patent: May 27, 2008

(54) CIRCUIT FOR ENABLING SENSE AMPLIFIER AND SEMICONDUCTOR MEMORY DEVICE HAVING THE SAME

(75) Inventors: Soo-Hwan Kim, Seongnam-si (KR); Chul-Sung Park, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 11/500,060

(22) Filed: Aug. 7, 2006

(65) Prior Publication Data

US 2007/0165474 A1 Jul. 19, 2007

(30) Foreign Application Priority Data

Jan. 17, 2006 (KR) .................. 10-2006-0004793

(51) Int. Cl.
G11C 7/04 (2006.01)

(52) U.S. Cl. ....................... 365/194; 365/207

(58) Field of Classification Search ............... 365/211
See application file for complete search history.

(56) References Cited

U.S. PATENT DOCUMENTS

| | | | | |
|---|---|---|---|---|
| 5,627,789 A | * | 5/1997 | Kalb, Jr. ............... | 365/205 |
| 5,682,353 A | * | 10/1997 | Eitan et al. ............ | 365/233 |
| 6,208,583 B1 | * | 3/2001 | Fujiwara ............... | 365/233 |
| 6,765,836 B2 | * | 7/2004 | Menczigar ............. | 365/212 |
| 6,950,354 B1 | * | 9/2005 | Akiyoshi .............. | 365/200 |
| 7,002,857 B2 | * | 2/2006 | Kang .................. | 365/194 |
| 7,177,207 B1 | * | 2/2007 | Vernenker et al. ...... | 365/194 |

\* cited by examiner

*Primary Examiner*—Tan T. Nguyen
(74) *Attorney, Agent, or Firm*—F. Chau & Assoc., LLC

(57) ABSTRACT

A circuit for enabling a sense amplifier in a semiconductor memory device includes a delay unit for outputting the delayed sense amplifier enable signal as a sense amplifier enable delay signal after delaying a sense amplifier enable signal in response to a delay control signal; and a delay control unit for controlling an intensity of the delay control signal by receiving a reference signal having a temperature reduction dependent characteristic. The length of the sensing time can increase by adjusting the delay at the sense amplifier enable signal according to a temperature decrease when a memory cell is formed on a silicon on insulator, and the sense amplifier enabling circuit is formed on a bulk silicon layer. In addition, the enable time point in the sense amplifier can be smoothly adjusted, and the possibility of operation failure in the semiconductor memory device can be reduced by reducing the occurrence of the sensing failure at the sense amplifier.

20 Claims, 10 Drawing Sheets

CIRCUIT FOR ENABLING SENSE AMPLIFIER AND SEMICONDUCTOR MEMORY DEVICE HAVING THE SAME

CROSS-REFERENCE TO RELATED APPLICATION

This application claims the benefit of Korean Patent Application No. 10-2005-0004793, filed Jan. 17, 2006, the disclosure of which is hereby incorporated herein by reference in its entirety.

BACKGROUND OF THE INVENTION

1. Technical Field

The present disclosure relates to a circuit for enabling a sense amplifier in a semiconductor memory device and, more particularly, to a circuit for enabling a sense amplifier in a semiconductor memory device that is capable of adjusting an enable time of the sense amplifier according to a temperature change.

2. Discussion of Related Art

In fabricating an MOS transistor, a large isolation region is generally formed to provide isolation between devices and to prevent a latch-up phenomenon in the MOS transistor. In this case, the isolation region increases the area of a chip and degrades integration. Silicon on insulator (SOI) has been conventionally suggested to solve such problems.

The SOI is a technique of more efficiently isolating semiconductor devices formed on a silicon substrate, and has a structure in which a mono-crystalline silicon layer is laid on an insulating layer. Because the SOI structure has a thin insulating layer buried between a surface of a wafer, which forms a circuit, and an under layer, the SOI is more robust against light and a high supply voltage, as compared to a junction isolation structure. Advantageously, a device formed on SOI requires a smaller number of processes than a device formed on a bulk silicon layer and has less capacitive coupling between devices formed in a chip.

When devices are formed on both a lower bulk silicon layer and an upper mono-crystalline silicon layer, a resultant structure has a stacked solid form. Accordingly, a semiconductor memory device having this structure is defined as a semiconductor memory device of a stack type. For example, if a memory cell of an SRAM is formed, the SRAM having that structure is defined as an SRAM of a stack type.

Examples of a semiconductor memory device having the SOI are disclosed in U.S. Pat. Nos. 6,060,738 and 6,288,949.

When a memory cell is formed on the SOI, it may be inferior in operation to a memory cell formed on a bulk silicon layer due to its structural features, for example, a back bias voltage (VBB) is allowed to be applied to the device formed on a lower bulk silicon, but not to the device formed on the SOI.

In particular, in conventional memory cells formed on a bulk silicon substrate, since a temperature decrease leads to performance improvement of a transistor, pulse width or sensing time reduction due to a temperature decrease is not problematic.

In the memory cells formed on SOI, however, a delay reduction at the transistor due to temperature increase may be problematic.

In addition, when the bulk silicon is used with the SOI, a control circuit for controlling a delay at the transistors is needed, since the delay according to the temperature may differ.

FIG. 1 is a circuit diagram showing a conventional sense amplifier enabling circuit.

Referring to FIG. 1, a conventional semiconductor memory device includes a memory cell 2, a sense amplifier 4, and a sense amplifier enabling circuit 6.

In a read operation of the semiconductor memory device, data dat a and data dat aB stored in the memory cell 2 are transferred to a pair of bit lines corresponding to the memory cell 2. The data dat a and dat aB are sensed and amplified by the sense amplifier 4 and then output along a read path RD. Typically, a word line connected to the memory cell 2 needs to be first selected by a row address decoder (not shown).

A sensing margin of the pair of bit lines should be sufficient from a time point at which the word line connected with the memory cell 2 is selected to a time point at which the sense amplifier 4 is enabled, that is, a sense amplifier enable signal is applied. This is shown in the timing diagram of FIG. 2 and, thus, will be described with reference to FIG. 2.

The sense amplifier enabling circuit 6 receives an externally applied sense amplifier enable signal SA_EN. The sense amplifier enabling circuit 6 generates a sense amplifier enable delay signal DSA_EN and applies it to the sense amplifier 4. The sense amplifier enabling circuit 6 includes one or more inverters INV1, INV2, INV3, and INV4. The sense amplifier enable delay signal DSA_EN is a signal obtained by delaying the sense amplifier enable signal SA_EN for a predetermined time at the sense amplifier enabling circuit 6.

For example, the inverter INV1 includes a PMOS transistor PM1 and an NMOS transistor NM1. Gates of the PMOS transistor PM1 and the NMOS transistor NM1 are connected to each other. A power voltage VCC is applied to a source of the PMOS transistor PM1, and a source of the NMOS transistor NM1 is grounded. Drains of the PMOS transistor PM1 and the NMOS transistor NM1 are connected to each other, and a connection between the drains is an output terminal of the inverter INV1. While only one inverter INV1 has been described by way of example, the other inverters INV2, INV3, and INV4 have the same configuration as the inverter INV1. The number of inverters may be variously changed.

The sense amplifier enabling circuit 6 is generally formed on a bulk silicon layer. When the memory cell 2 is formed on the bulk silicon, performance of a memory cell is improved as the temperature decreases, and the sensing time correspondingly decreases. In a semiconductor memory device having a memory cell formed on SOI or a memory cell having an opposite tendency according to temperature relative to a conventional memory cell, however, the use of a sense amplifier enabling circuit formed on a bulk silicon layer, as in the prior art, causes the following problems.

First, if the sense amplifier enabling circuit is configured in consideration of a sensing time and a sensing margin at a high temperature, a failure is caused because the performance of the memory cell is degraded as the temperature decreases.

On the contrary, if the sense amplifier enabling circuit is configured in consideration of the sensing time and the sensing margin at a low temperature, the sensing is made relatively excellent due to the performance of the memory cell being improved as the temperature increases. Since a delay amount in the sense amplifier enabling circuit at a high temperature is greater than an actually required amount than at a low temperature, however, the cycle time is reduced.

FIG. 2 is a timing diagram illustrating the sensing margin and the sensing time present in the circuit shown in FIG. 1.

Referring to FIG. 2, a timing diagram of a pair of bit lines BL and BLB and a sense amplifier enable delay signal DSA_EN is shown.

The pair of bit lines BL and BLB are lines via which the data dat a and dat aB are transferred from the memory cell to the sense amplifier in FIG. 1. Accordingly, the pair of bit lines BL and BLB may be considered as the lines indicated as dat a and dat aB in FIG. 1.

The sense amplifier enable delay signal DSA_EN is a signal obtained by delaying the sense amplifier enable signal SA_EN by the sense amplifier enabling circuit 6, as described above.

The reference character t1 indicates the sensing time and the reference character m1 indicates the sensing margin. The sensing time t1 refers to a period of time from a time at which the word line is enabled to a time at which the sense amplifier is enabled by a sense amplifier enable signal. The sensing margin m1 refers to a minimal width within which the enabled sense amplifier can sense and amplify data on the pair of bit lines BL and BLB.

When the data in the memory cell is loaded on the pair of bit lines BL and BLB after the word line (not shown) is selected, the pair of bit lines BL and BLB will have a predetermined sensing margin m1. Since the sensing margin m1 is a minimal width that allows the enabled sense amplifier to sense and amplify data on the pair of bit lines BL and BLB, the sense amplifier enable signal SA_EN needs to be applied at a time point when the sensing margin is greater than the sensing margin m1. That is, the sense amplifier enable signal SA_EN has to be applied after the sensing time t1 lapses, such that a sensing failure does not occur.

The sensing margin and sensing time vary with temperature. This will be described with reference to FIG. 3.

FIG. 3 is a timing diagram illustrating the sensing margin and sensing time according to the temperature in the sense amplifier enabling circuit of FIG. 1

Referring to FIG. 3, the sensing margin and the sensing time varying with temperature are shown. The sensing margin m1 and the sensing time t1 are values present at a normal temperature, and a sensing margin m2 is sensed in a sensing time t2. When a sense amplifier enabling circuit is formed on a bulk silicon layer, the current driving capability of the transistors constituting the sense amplifier enabling circuit is improved as the temperature decreases, such that a delay at the sense amplifier enabling circuit decreases. Accordingly, the sensing time t2 is smaller than the sensing time t1. A sensing margin m3 indicates a minimum width of data that can be sensed by the sense amplifier. The sensing time t3 is a time needed to reach the sensing margin m3 and is greater than the normal sensing time t1.

For example, in a semiconductor memory device having a memory cell formed on an SOI, current driving capability of transistors constituting the memory cell is degraded when the temperature decreases. Accordingly, the sensing margin m2 at the sensing time t2 is smaller than the sensing margin m1, as described above. In this case, a failure occurs in the read operation of the semiconductor memory device.

In this case, if the sensing margin is to be greater than m3 in order to prevent a failure from occurring, the sensing time has to increase to t3. That is, the sense amplifier enabling circuit needs to additionally delay the sense amplifier enable signal by t3-t1 in addition to the normal sensing time t1.

In this manner, in the case of a typical memory cell formed on the bulk silicon layer, the current driving capability of a transistor constituting the memory cell increases as the temperature decreases. Accordingly, a decrease of the sensing time t1 to the sensing time t2 is not problematic. This is because the sensing margin increases correspondingly.

In the case of a memory cell formed on an SOI, however, since the current driving capability of a transistor constituting the cell is degraded as the temperature decreases, the sensing time needs to increase in order to obtain a sensing margin allowing the sense amplifier to sense and amplify data on the pair of bit lines.

SUMMARY OF THE INVENTION

Exemplary embodiments of the present invention provide a sense amplifier enabling circuit and a semiconductor memory device having the same, which are capable of solving a problem of a sensing time increase in the semiconductor memory device in which the current driving capability of a transistor constituting a memory cell is degraded as temperature decreases.

An exemplary embodiment of the present invention provides a sense amplifier enabling circuit and a semiconductor memory device having the same, which are capable of reducing the occurrence of a failure by sensing a failure reduction in the operation of the semiconductor memory device.

An exemplary embodiment of the present invention provides a sense amplifier enabling circuit and a semiconductor memory device having the same, which are capable of controlling an enable time point of the sense amplifier.

An exemplary embodiment of the present invention provides a sense amplifier enabling circuit and a semiconductor memory device having the same, which are capable of providing greater sensing time according to a temperature decrease when a memory cell is formed on SOI and the sense amplifier enabling circuit is formed on a bulk silicon layer.

An exemplary embodiment of the present invention provides a sense amplifier enabling circuit and a semiconductor memory device having the same, which are capable of reducing the occurrence of a failure caused by the degraded performance of a memory cell as the temperature decreases when the sense amplifier enabling circuit is configured in consideration of a sensing time and a sensing margin at a high temperature.

An exemplary embodiment of the present invention provides a sense amplifier enabling circuit and a semiconductor memory device having the same, which are capable of solving a problem of cycle time reduction caused when a delay amount in the sense amplifier enabling circuit is greater than an actually required amount due to the performance of a memory cell being improved according to a temperature increase when the sense amplifier enabling circuit is configured in consideration of the sensing time and the sensing margin at a low temperature.

In accordance with an exemplary embodiment, the present invention provides a circuit for enabling a sense amplifier in a semiconductor memory device, the circuit including: a delay unit for outputting the delay signal as a sense amplifier enable delay signal after delaying a sense amplifier enable signal in response to a delay control signal; and a delay control unit for controlling the intensity of the delay control signal by receiving a reference signal having a temperature reduction dependent characteristic.

The semiconductor memory device may be a stack type semiconductor memory device.

The temperature reduction dependent characteristic may be a characteristic that a voltage level of the reference signal decreases as the temperature decreases.

The delay unit may include a PMOS transistor connected between a first power voltage terminal and an output terminal of the delay unit, and having a gate receiving the sense amplifier enable signal; and at least one unit inverter connected between the output terminal of the delay unit and the delay control unit and including an NMOS transistor sharing the gate of the PMOS transistor.

The delay control unit may be connected between a source of the NMOS transistor in the unit inverter and ground and include a control transistor having a gate receiving a reference signal. The control transistor may be an NMOS transistor.

The sense amplifier enabling circuit may further include a reference signal generating unit for generating the reference signal.

The reference signal generating unit may include a default voltage setting unit for providing the reference signal to an output terminal of the reference signal generating unit when an external power voltage is greater than a first power voltage; a reference signal adjusting unit for finely adjusting the reference signal in consideration of a delay element caused by a process change; and a low voltage setting unit for providing a reference signal having a certain level to the output terminal of the reference signal generating unit when the external power voltage is smaller than the first power voltage.

The default voltage setting unit may include a first PMOS transistor connected between a first power voltage terminal and the output terminal of the reference signal generating unit; and at least one NMOS transistor connected in series between the output terminal of the reference signal generating unit and ground and having a common gate receiving the first power voltage.

The reference signal adjusting unit may include a voltage distributing circuit controlled by a bypass signal dependent on a result of a testing delay caused by a process change, and enabling a second power voltage to be distributed and applied to a substrate of the first PMOS transistor.

The low voltage setting unit may include a second PMOS transistor connected between the first power voltage terminal and the output terminal of the reference signal generating unit; and a comparator for comparing a first input signal to a second input signal and outputting a signal to the gate of the second PMOS transistor in order to turn the second PMOS transistor on or off.

The comparator may output a signal for turning the second PMOS transistor on when the external power voltage is smaller than the first power voltage, and output a signal for turning the second PMOS transistor off when the external power voltage is greater than the first power voltage.

In accordance with an exemplary embodiment, the present invention provides a circuit for enabling a sense amplifier in a semiconductor memory device, the circuit including: a delay unit for outputting the delayed sense amplifier enable signal as a sense amplifier enable delay signal after delaying a sense amplifier enable signal in response to a delay control signal; a reference signal generating unit for generating a reference signal having a temperature reduction dependent characteristic; and a delay control unit for controlling an intensity of the delay control signal by receiving the reference signal.

The reference signal generating unit may include a default voltage setting unit for providing the reference signal to an output terminal of the reference signal generating unit when an external power voltage is greater than a first power voltage; a reference signal adjusting unit for finely adjusting the reference signal in consideration of a delay element caused by a process change; and a low voltage setting unit for providing a reference signal having a certain level to the output terminal of the reference signal generating unit when the external power voltage is smaller than the first power voltage.

The delay control unit may include at least one control transistor connected between a source of an NMOS transistor in the delay unit and ground and having a gate receiving the reference signal.

The default voltage setting unit may include a first PMOS transistor connected between a first power voltage terminal and the output terminal of the reference signal generating unit; and at least one NMOS transistor connected in series between the output terminal of the reference signal generating unit and ground and having a common gate receiving the first power voltage.

The reference signal adjusting unit may include a voltage distributing circuit controlled by a bypass signal dependent on a result of a testing delay caused by a process change, and enabling an external power voltage to be distributed and applied to a substrate of the first PMOS transistor.

The low voltage setting unit may include a second PMOS transistor connected between the first power voltage terminal and the output terminal of the reference signal generating unit; and a comparator for comparing a first input signal to a second input signal and outputting a signal to the gate of the second PMOS transistor in order to turn the second PMOS transistor on or off.

In accordance with an exemplary embodiment, the present invention provides a semiconductor memory device of a stack type, including: a sense amplifier for sensing and amplifying data on a bit line; and a sense amplifier enabling circuit for generating a sense amplifier enable delay signal for enabling the sense amplifier by receiving a reference signal having a temperature reduction dependent characteristic.

The sense amplifier enabling circuit may include a delay unit for outputting the delayed sense amplifier enable signal as the sense amplifier enable delay signal after delaying a sense amplifier enable signal in response to a delay control signal; a reference signal generating unit for generating the reference signal; and a delay control unit for controlling the intensity of the delay control signal by receiving the reference signal.

BRIEF DESCRIPTION OF THE DRAWINGS

Exemplary embodiments of the present invention will be understood in more detail from the following description taken in conjunction with the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art.

Figure 1:
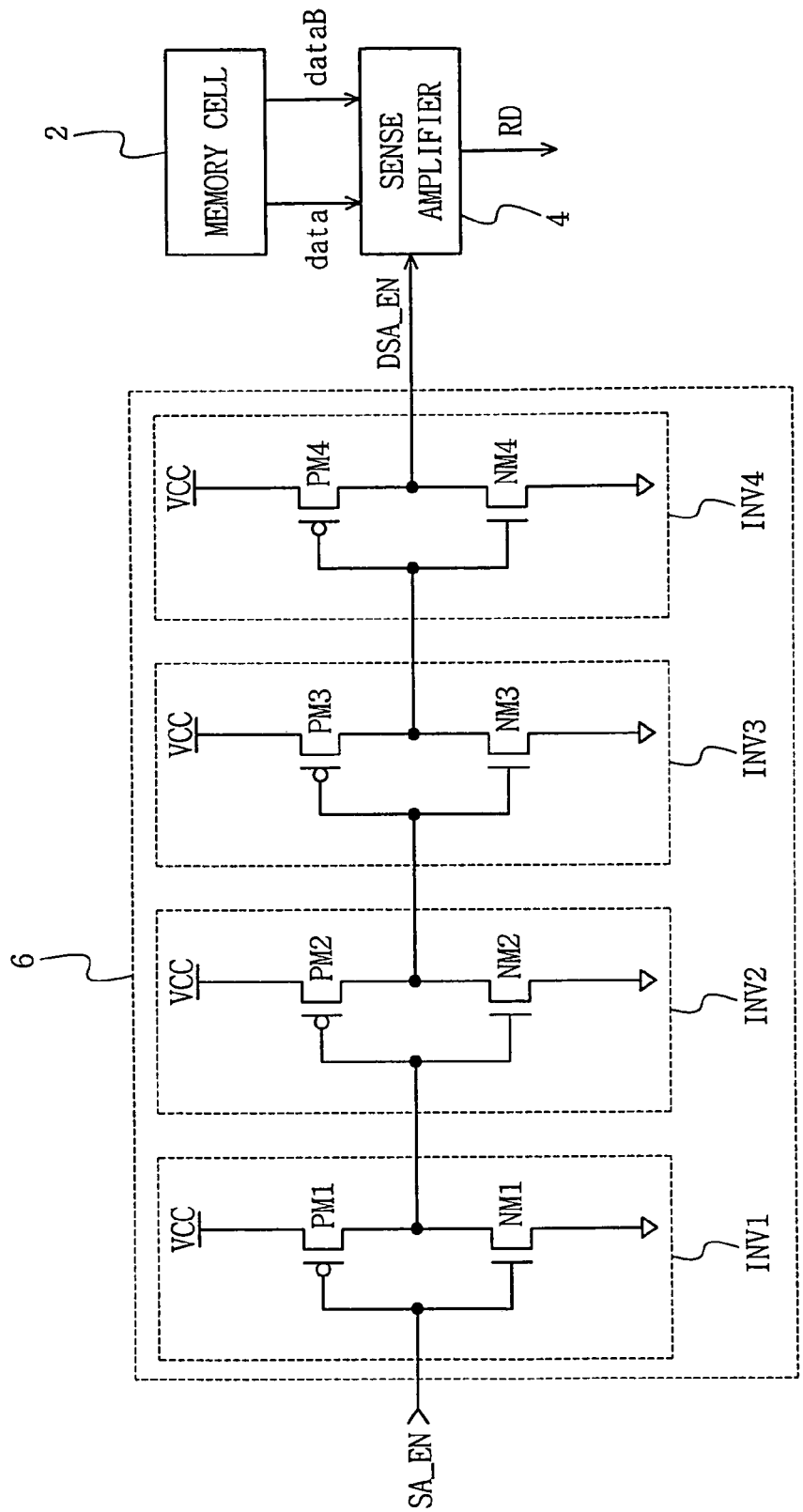
FIG. 1 is a circuit diagram illustrating a conventional sense amplifier enabling circuit.
Figure 2:
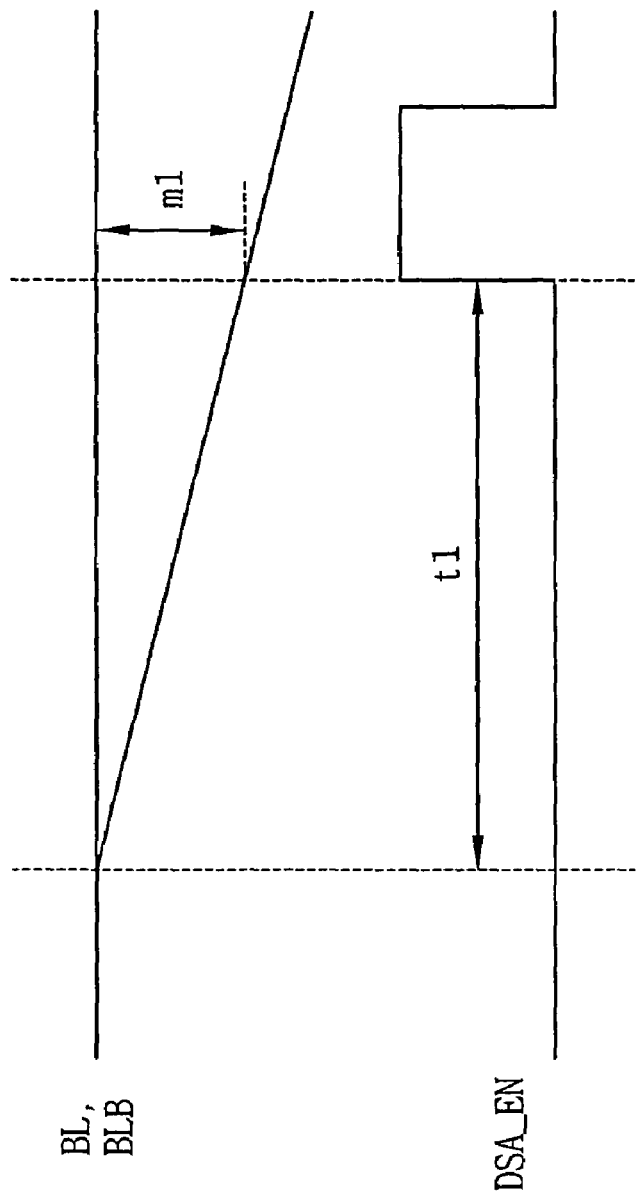
FIG. 2 is a timing diagram illustrating sensing margin and sensing time.
Figure 3:
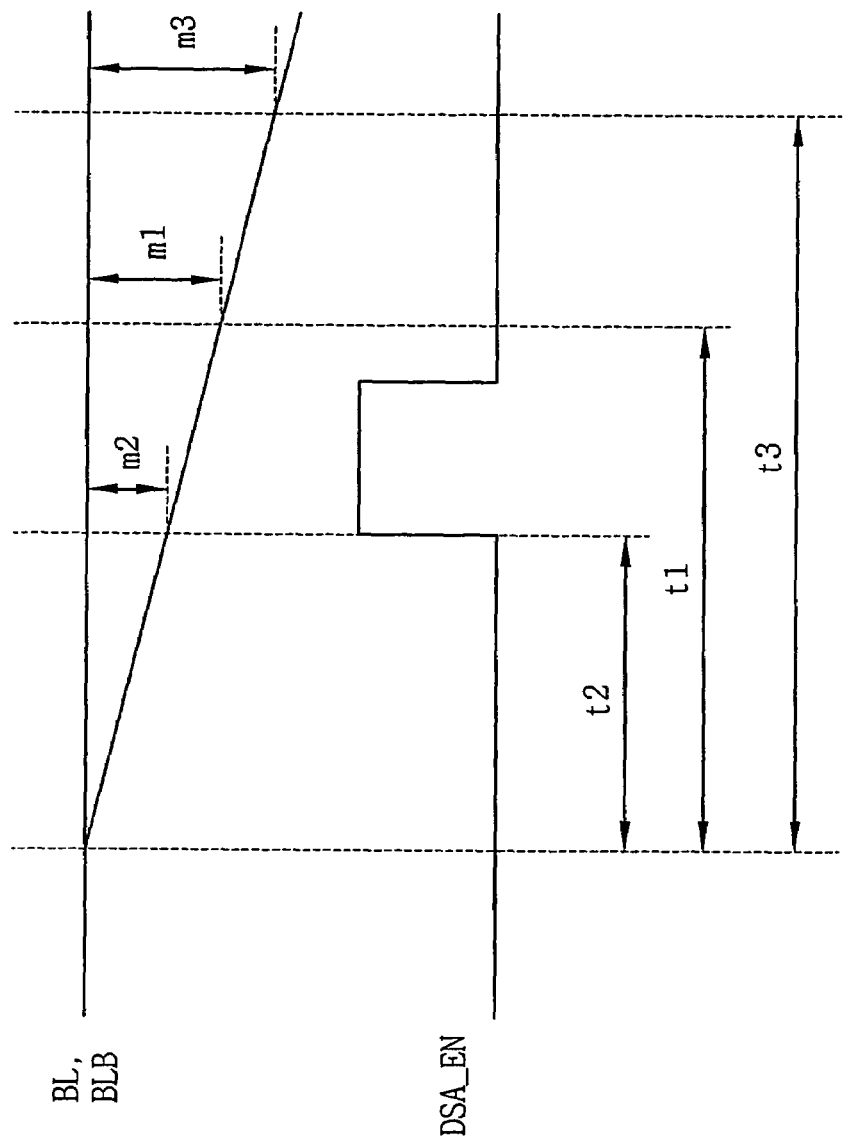
FIG. 3 is a timing diagram illustrating sensing margin and sensing time according to temperature in the sense amplifier enabling circuit of FIG. 1.
Figure 4:
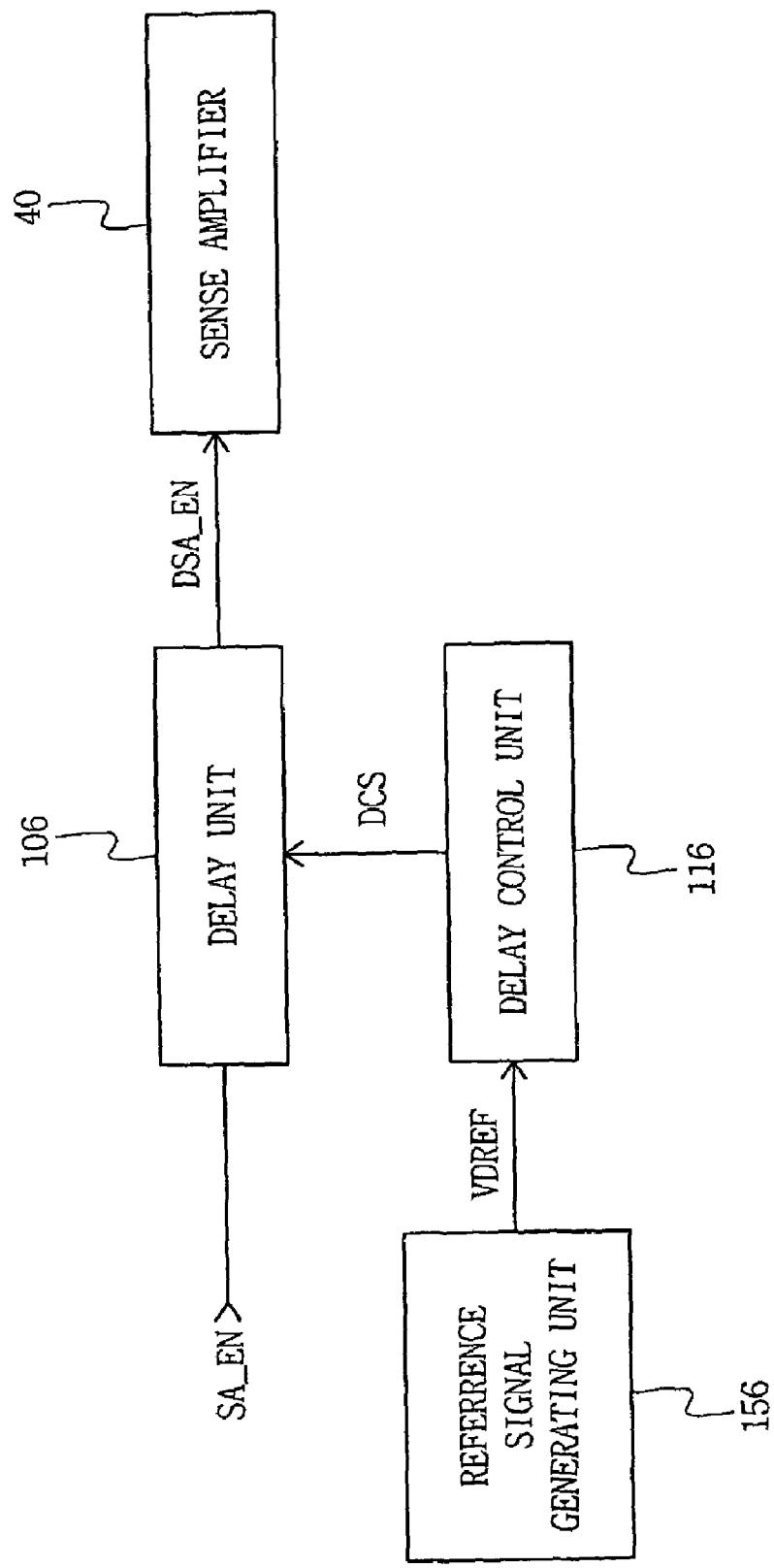
FIG. 4 is a schematic block diagram illustrating a configuration of a sense amplifier enabling circuit according to an exemplary embodiment of the present invention.

FIG. 4 is a schematic block diagram illustrating a configuration of a sense amplifier enabling circuit according to an exemplary embodiment of the present invention.

Referring to FIG. 4, the sense amplifier enabling circuit includes a sense amplifier 40, a delay unit 106, a delay control unit 116, and a reference signal generating unit 156.

The sense amplifier 40 senses and amplifies data on a bit line (not shown).

The delay unit 106 outputs a sense amplifier enable delay signal DSA_EN for enabling the sense amplifier 40 after delaying a sense amplifier enable signal SA_EN in response to a delay control signal DCS. More specifically, the delay unit 106 delays the sense amplifier enable signal SA_EN in response to the delay control signal DCS generated by the delay control unit 116. The delay unit 106 outputs the delayed sense amplifier enable signal SA_EN as a sense amplifier enable delay signal DSA_EN that is a signal for enabling the sense amplifier 40.

The delay control unit 116 receives a reference signal VDREF to control the intensity of the delay control signal DCS. The reference signal VDREF has a temperature reduction dependent characteristic. The temperature reduction dependent characteristic of the reference signal VDREF refers to a characteristic that a voltage level of the reference signal VDREF decreases as the temperature decreases. The reference signal VDREF will now be described in detail with reference to FIG. 6.

The reference signal generating unit 156 generates the reference signal VDREF for controlling the delay control unit 116.

The delay unit 106 and the delay control unit 116 will be described in detail with reference to FIG. 5, and the reference signal generating unit 156 will be described in detail with reference to FIG. 7.

Figure 5:
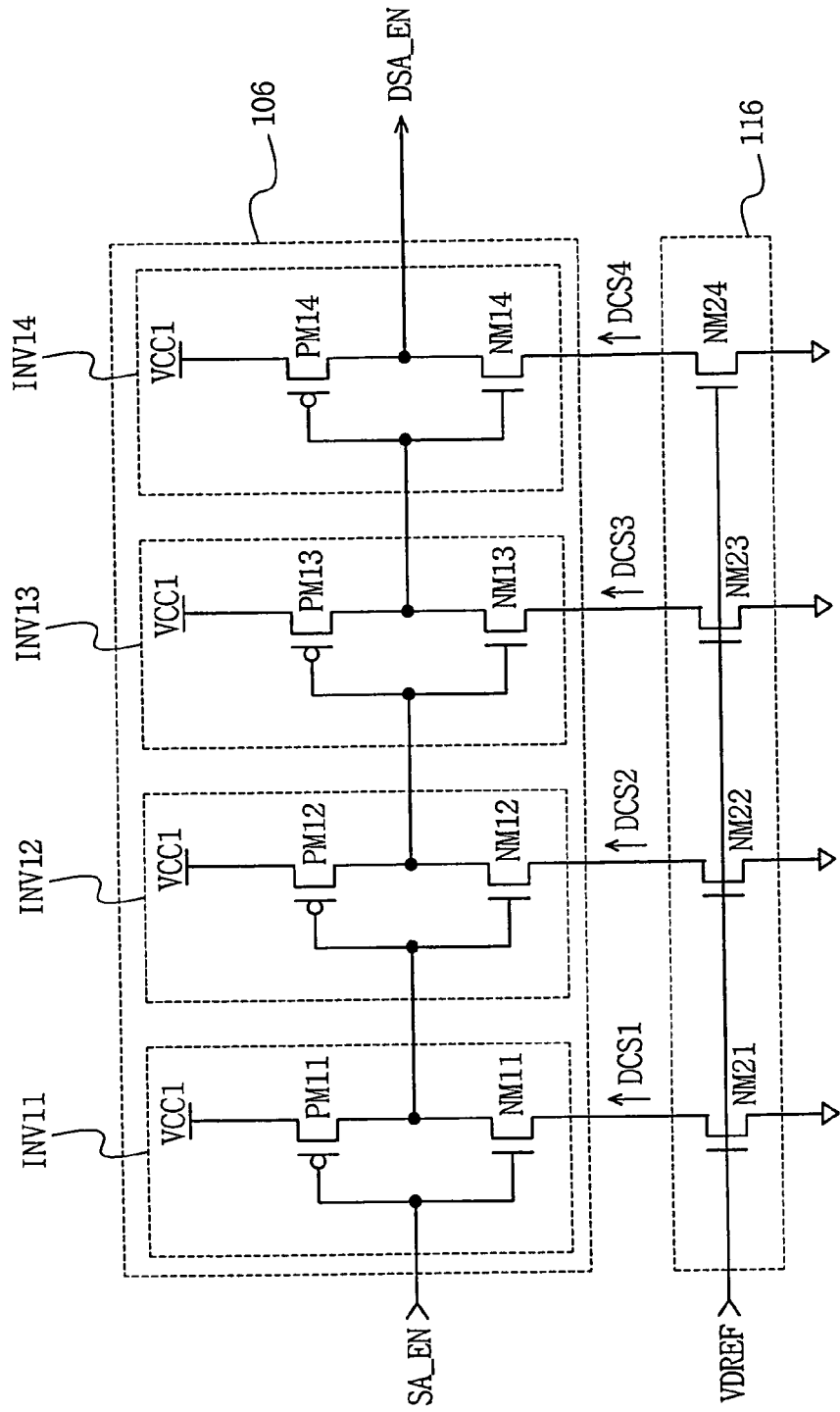
FIG. 5 is a circuit diagram illustrating a delay unit and delay control unit in FIG. 4.

FIG. 5 is a circuit diagram illustrating the delay unit 106 and the delay control unit 116 in FIG. 4.

The delay unit 106 includes at least one inverter, and four inverters INV11, INV12, INV13, and INV14 are shown. The delay unit 106 delays the sense amplifier enable signal SA_EN to output the sense amplifier enable delay signal DSA_EN.

The sense amplifier enable signal SA_EN is a signal for enabling the sense amplifier for sensing and amplifying data on a pair of bit lines (not shown) in a semiconductor memory device. The sense amplifier enable delay signal DAS_EN is a signal formed by delaying the sense amplifier enable signal SA_EN and, thus, is also called a delayed sense amplifier enable signal.

The delay control unit 116 includes control transistors NM21, NM22, NM23, and NM24 respectively connected to the corresponding inverters INV11, INV12, INV13, and INV14 constituting the delay unit 106. The control transistors NM21, NM22, NM23, and NM24 are respectively connected to NMOS transistors NM11, NM12, NM13, and NM14 that are pull-down transistors in the inverters INV11, INV12, INV13 and INV14 constituting the delay unit 106. The control transistors NM21, NM22, NM23, and NM24 output delay control signals DCS1, DCS2, DCS3, and DCS4, respectively. The number of inverters and control transistors may be variously changed according to required delay time.

For example, the inverter INV11 comprises a PMOS transistor PM11 and an NMOS transistor NM11. A power voltage VCC1 is applied to a source of the PMOS transistor PM11, and the control transistor NM21 constituting the delay control unit 116 is applied to a source of the NMOS transistor NM11. A drain terminal of the control transistor NM21 is connected to the source of the NMOS transistor NM11 in the inverter NV11, and a source of the control transistor NM21 is grounded. A reference signal VDREF is applied to the gate of the control transistor NM21. A voltage level of the reference signal VDREF decreases as the temperature decreases. The control transistor NM22 is connected to the inverter INV12, the control transistor NM23 is connected to the inverter INV13, and the control transistor NM24 is connected to the inverter INV14. The control transistors NM21, NM22, NM23, and NM24 may be NMOS transistors. The power voltage VCC1 is a voltage output from the internal voltage converter and is at a lower level than a power voltage VCC2 that will be described later.

In this manner, the delay control unit 116 is connected to the delay unit 106 and controls intensity of the delay control signals DCS1 to DCS4 by receiving the reference signal VDREF. That is, current through the delay control unit 116 is adjusted according to the level of the reference signal VDREF.

More specifically, in an active region of the control transistors NM21, NM22, NM23, and NM24, when the reference signal VDREF increases, current between the drain and the source of the control transistors NM21, NM22, NM23, and NM24 increases. In this case, the driving capability of the control unit 106 is improved and a time point at which the sense amplifier enable delay signal DSA_EN is output is advanced. That is, the delay provided by the delay unit 106 is reduced.

On the other hand, when the level of the reference signal VDREF decreases, the current between the drain and the source of the control transistors NM21, NM22, NM23, and NM24 decreases. In this case, driving capability of the control unit 106 is degraded, such that a time point at which the sense amplifier enable delay signal DSA_EN is output is retarded. That is, a delay provided by the delay unit 106 increases.

Figure 6:
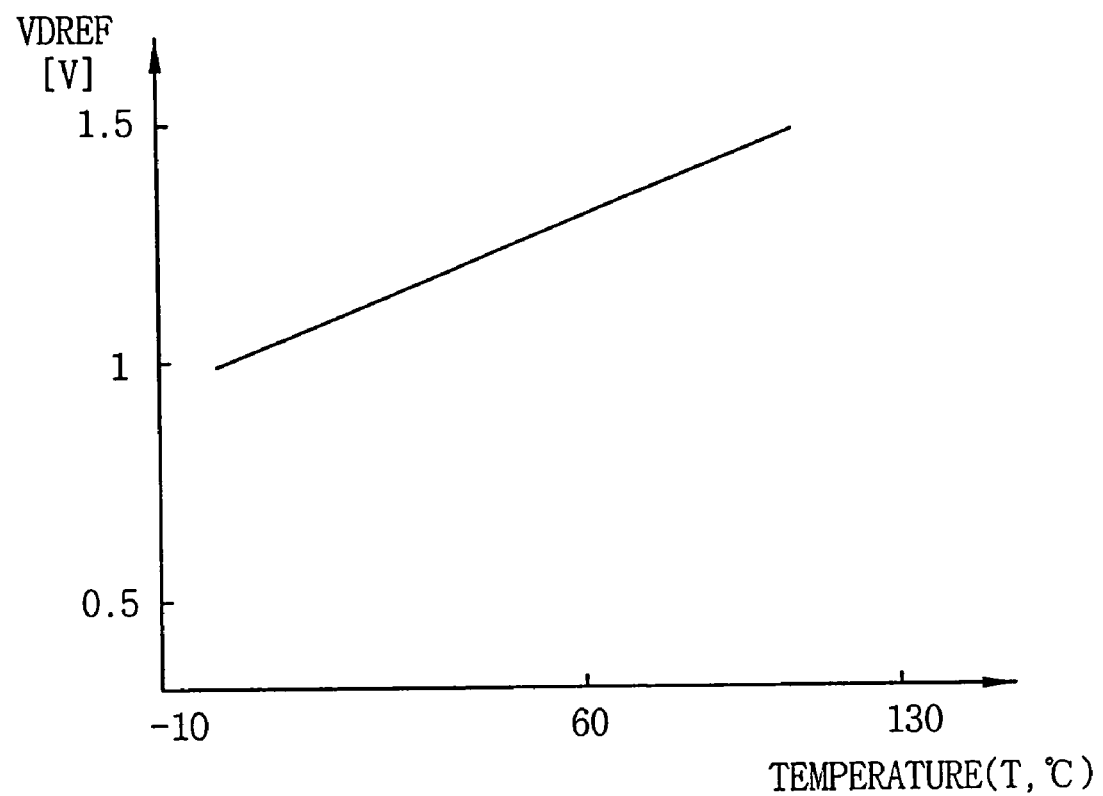
FIG. 6 is a graph illustrating change in a reference signal according to temperature in FIG. 5.

FIG. 6 is a graph illustrating a change in the reference signal according to temperature in FIG. 5.

Referring to FIG. 6 it is seen that, a voltage level of the reference signal VDREF increases as the temperature increases. That is, the reference signal VDREF has a directly proportional temperature reduction dependent characteristic.

When a memory cell is formed on an SOI, the current driving capability of a transistor constituting the memory cell is degraded as the temperature decreases. Accordingly, the delay control unit (116 of FIG. 5) operates to reduce the voltage level of the reference signal VDREF according to a temperature decrease in order to increase the delay at the delay unit (106 of FIG. 5). Thus, a sufficient sensing margin allowing the sense amplifier to sense a signal on the bit line is obtained.

When a memory cell is formed on an SOI, the semiconductor memory device may be considered as a stack type of semiconductor memory device. That is, memory cells in the semiconductor memory device of the stack type are formed and stacked on a bulk silicon layer and mono-crystalline silicon layers.

Figure 7:
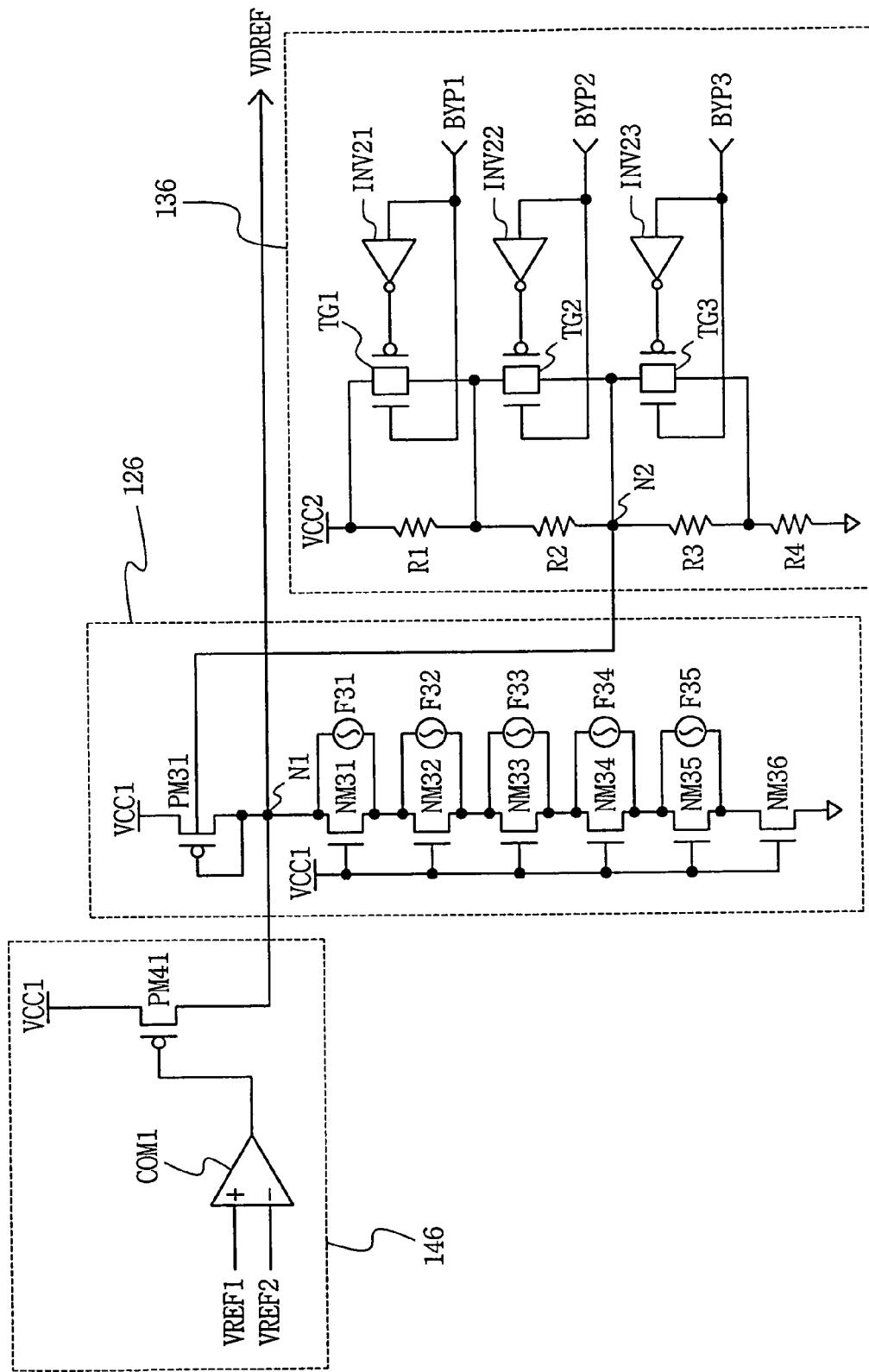
FIG. 7 is a circuit diagram illustrating a reference signal generating unit for generating a reference signal in FIG. 5.

FIG. 7 is a circuit diagram illustrating a reference signal generating unit for generating a reference signal VDREF in FIG. 5.

Referring to FIG. 7, the reference signal generating unit includes a default voltage setting unit 126, a reference signal adjusting unit 136, and a low voltage setting unit 146.

The default voltage setting unit 126 includes a first PMOS transistor PM31, at least one NMOS transistor NM31 to NM36, and fuses F31 to F35.

The first PMOS transistor PM31 is connected between a first power voltage terminal VCC1 and an output terminal N1 of the reference signal generating unit.

The five NMOS transistors NM31 to NM36 of this exemplary embodiment are connected in series between the output terminal N1 of the reference signal generating unit and ground, and the first power voltage VCC1 is applied to a common gate.

The fuses F31 to F35 determine whether the NMOS transistors NM31 to NM36 contribute to change in a voltage level at the output terminal N1 of the reference signal generating unit. That is, if the fuses are open, the NMOS transistors NM31 to NM36 contribute to the change in the voltage level of the output terminal of the reference signal generating unit N1, and if the fuses are not opened and kept in a short-circuited state, the NMOS transistors NM31 to NM36 do not contribute to the change in the voltage level at the output terminal of the reference signal generating unit N1.

Figure 8:
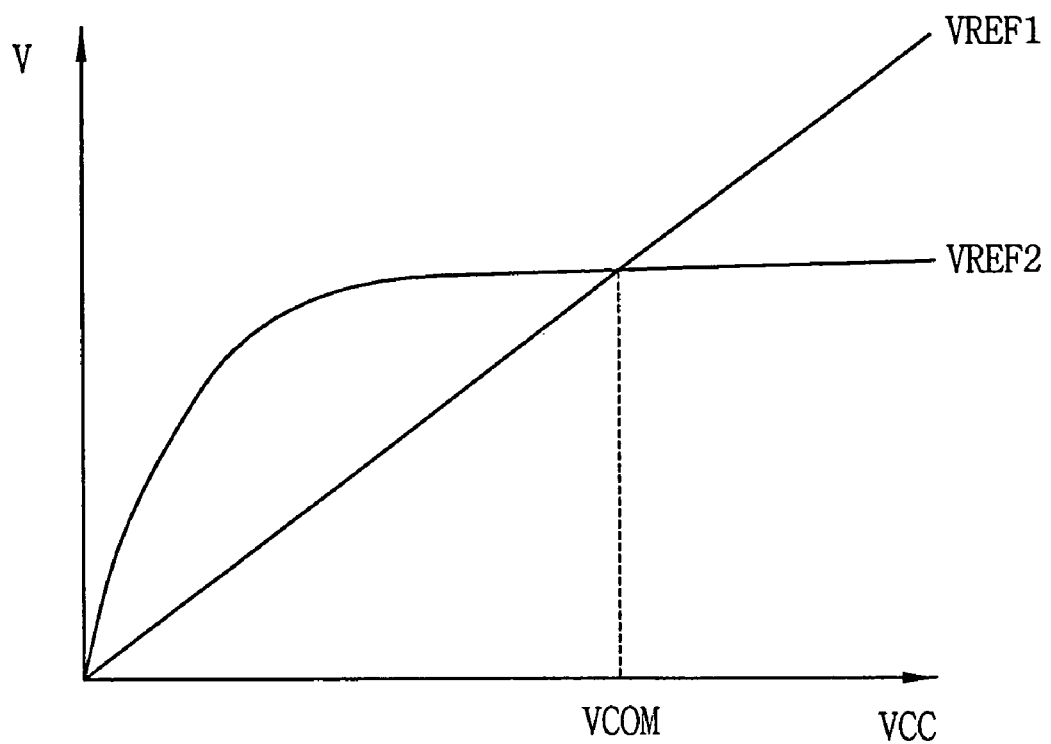
FIG. 8 is a graph showing two input signals input to a comparator in FIG. 7.

Thus, when the first power voltage VCC1 is greater than a predetermined voltage VCOM, the default voltage setting unit 126 provides the reference signal VDREF to the output terminal N1 of the reference signal generating unit. The voltage VCOM is shown in FIG. 8.

Since a threshold voltage of the first PMOS transistor PM31 increases as the temperature decreases, the voltage at the output terminal N1 of the reference signal generating unit decreases as temperature decreases.

The reference signal adjusting unit 136 is controlled by the bypass signals BYP1, BYP2, and BYP3 and distributes the second power voltage VCC2. The bypass signals BYP1, BYP2, and BYP3 are selected according to a result of testing delay caused by a process change. Thus, the reference signal adjusting unit 136 provides the distributed voltage to a node N2 and to a substrate of the first PMOS transistor PM31.

The voltage applied to the substrate of the first PMOS transistor PM31 is also called a substrate bias voltage or back bias voltage, and is generally indicated by VBB. That is, the voltage VBB is applied to an N-well surrounding the first PMOS transistor PM31. The voltage VBB is produced from voltage VCC by an internal substrate bias circuit. The voltage VBB is applied to prevent a PN junction in a chip from being partially forward biased and, thus, to prevent loss or latch-up of the data in a memory cell. Further, the voltage VBB is also applied to reduce change in a threshold voltage of a MOS transistor due to a body effect (or back gate effect) and thus to stabilize circuit operation.

The reference signal adjusting unit 136 provides the substrate bias voltage to the first PMOS transistor PM31 to adjust the threshold voltage of the first PMOS transistor PM31. This makes it possible to adjust the voltage level at the output terminal N1. That is, when the threshold voltage of the first PMOS transistor PM31 increases, the voltage level of the output terminal N1 is lowered and thus the level of the reference signal VDREF is also lowered. On the contrary, when the threshold voltage of the first PMOS transistor PM31 is lowered, the voltage level at the output terminal N1 increases and thus the level of the reference signal VDREF increases.

The bypass signal BYP1 or bypass signal BYP2 needs to be at a high level to increase the substrate bias voltage of the first PMOS transistor PM31, that is, the voltage at the node N2.

For example, when the bypass signal BYP1 is at a high level, the bypass signal BYP2 is at a low level, and the bypass signal BYP3 is at a low level, resistance from the second power voltage VCC2 to the ground is determined by R2, R3, and R4. That is, when the bypass signal BYP1 is at a high level, a first transfer gate TG1 is turned on and the first resistor R1 is short-circuited.

Thus, the voltage at the node N2 is higher than the voltage at the node N2 when all the resistors R1, R2, R3, and R4 are in the circuit and not short-circuited. The second resistor R2 is short-circuited by a second transfer gate TG2 receiving the bypass signal BYP2, and the third resistor R3 is short-circuited by a third transfer gate TG3 receiving the bypass signal BYP3.

If the bypass signals BYP1 and BYP2 are both at a high level, the voltage level at the node N2 becomes the same as the external power voltage VCC2.

In this manner, as the voltage level at the node N2 is adjusted, the substrate bias voltage of the first PMOS transistor PM31 is also adjusted. Thus, the threshold voltage of the first PMOS transistor PM31 is adjusted and the voltage level of the reference signal VDREF is adjusted.

The bypass signals BYP1, BYP2, and BYP3 have a high or low level according to a result of testing the delay caused by a process change. The number of resistors, transfer gates, and bypass signals may be variously changed according to the user's requirements.

In this manner, the reference signal adjusting unit 136 finely adjusts the reference signal VDREF in consideration of the delay element caused by the process change.

The low voltage setting unit 146 includes a second PMOS transistor PM41 and a comparator COM1.

The second PMOS transistor PM41 is connected between the first power voltage terminal VCC1 and the output terminal N1 of the reference signal generating unit.

The comparator COM1 compares the first input signal VREF1 to the second input signal VREF2 and outputs a signal to a gate of the second PMOS transistor PM41 in order to turn the second PMOS transistor PM41 on or off.

That is, if the external power voltage, that is, the first power voltage VCC1 is lower than the predetermined voltage VCOM, the comparator COM1 outputs a voltage for turning the second PMOS transistor PM41 on. If the first power voltage VCC1 is higher than the voltage VCOM, the comparator COM1 also outputs a signal for turning the second PMOS transistor PM41 off.

Thus, the low voltage setting unit 146 provides the reference signal at a certain level to the output terminal N1 of the reference signal generating unit when the first power voltage VCC1 is lower than the voltage VCOM.

FIG. 8 is a graph showing the two input signals VREF1 and VREF2 input to the comparator COM1 in FIG. 7.

The low voltage setting unit 146 will be further described with reference to FIGS. 7 and 8. When the first power voltage VCC1 is higher than the predetermined voltage VCOM, the second PMOS transistor PM41 is turned off, and when the first power voltage VCC1 is lower than the voltage VCOM, the second PMOS transistor PM41 is turned on. The comparator COM1 receives the input signals VREF1 and VREF2 and generates the signal for turning the second PMOS transistor PM41 on or off. The comparator COM1 suffices to receive the two input signals VREF1 and VREF2 and output different signals according to a difference between the two input signals VREF1 and VREF2, which may correspond to VCC1 and VCOM. Accordingly, the comparator COM1 may be formed of a differential amplifier receiving the input signals VREF1 and VREF2 as inputs.

Figure 9:
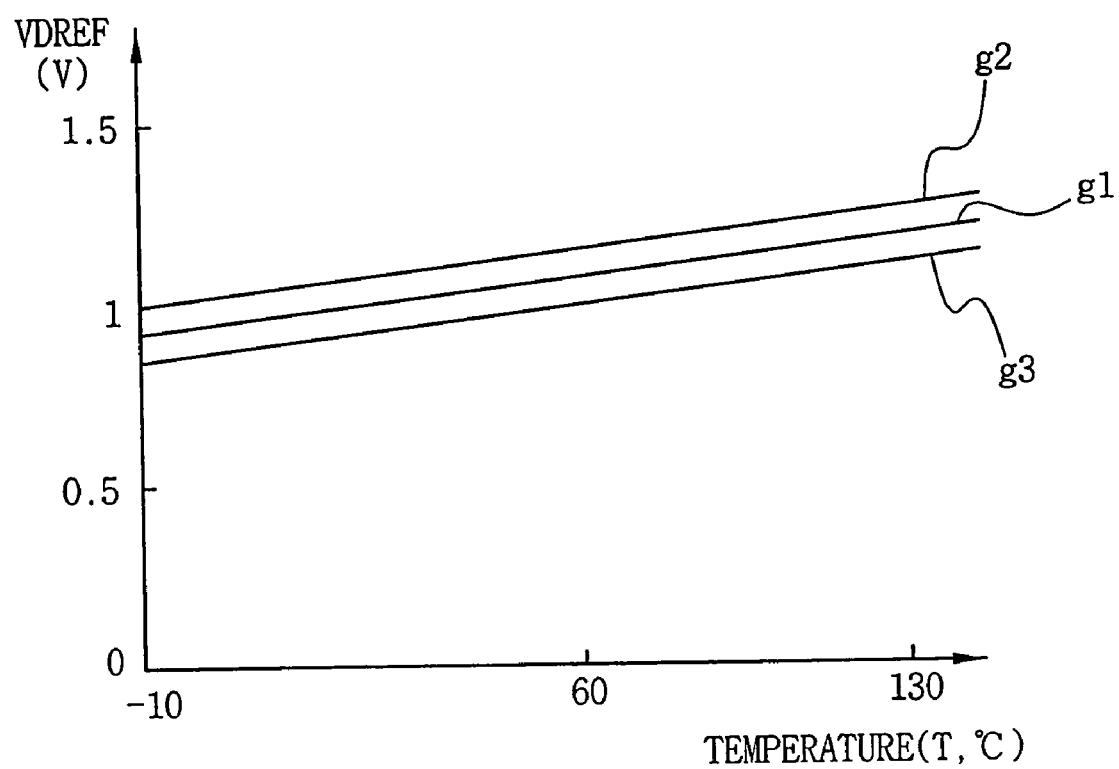
FIG. 9 is a graph showing change in a reference signal according to temperature in FIG. 7.

FIG. 9 is a graph showing change in a reference signal VDREF according to a change in temperature in the circuit of FIG. 7.

Referring to FIG. 9, the voltage level at the output terminal N1 the reference signal generating unit in FIG. 7, that is, the voltage level of the reference signal VDREF increases as temperature increases.

A response g1 corresponds to the case where the threshold voltage of the first PMOS transistor PM31 is not adjusted by the reference signal adjusting unit 136, and response g2 and g3 correspond to the case where the threshold voltage of the first PMOS transistor PM31 is adjusted by the reference signal adjusting unit 136. The response g2 corresponds to the case where the threshold voltage of the first PMOS transistor PM31 increases as the voltage at the output terminal N2 of the reference signal adjusting unit 136 increases, and the response g3 corresponds to the case where the threshold voltage of the first PMOS transistor PM31 decreases as the voltage at an output mode N2 of the reference signal adjusting unit 136 decreases. That is, as the threshold voltage of the first PMOS transistor PM31 decreases, the voltage level of the reference signal VDREF increases, and as a threshold voltage of the first PMOS transistor PM31 increases, the voltage level of the reference signal VDREF decreases.

Figure 10:
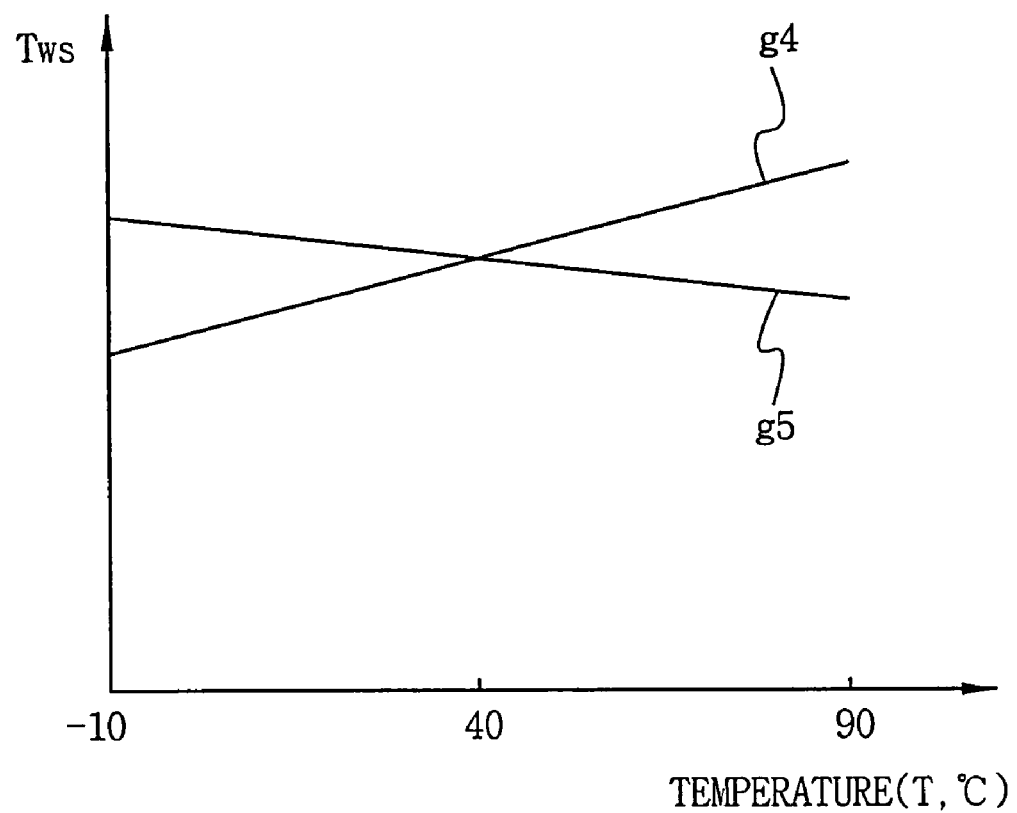
FIG. 10 is a graph showing a comparison between sense amplifier enable time according to temperature in an exemplary embodiment of the present invention and the prior art.

FIG. 10 is a graph plotting a sense amplifier enable time Tws versus temperature comparing an exemplary embodiment of the present invention and a prior art system.

Referring to FIG. 10, response g4 shows a conventional sense amplifier enable time Tws, and response g5 shows a sense amplifier enable time Tws in an exemplary embodiment of the present invention. Here, the sense amplifier enable time Tws is an elapse time from a time at which a word line is selected to a time at which the sense amplifier is enabled, and may be represented as delay.

In the conventional sense amplifier, the enable time Tws, that is, the delay, shown at g4 increases as temperature increases, while in the sense amplifier of the present invention, the enable time Tws, that is, the delay shown at g5 decreases as temperature increases.

In an exemplary embodiment of the present invention, it is possible to increase the sensing time by increasing the delay at the sense amplifier enable signal according to a temperature decrease when a memory cell is formed on SOI and a sense amplifier enabling circuit is formed on a bulk silicon layer.

Accordingly, it is possible to reduce occurrence of a failure, which occurs as the temperature decreases by configuring the sense amplifier enabling circuit in consideration of the sensing time and sensing margin at a high temperature in designing a semiconductor memory device. In addition, it is possible to solve a problem caused as the temperature increases by configuring the sense amplifier enabling circuit in consideration of the sensing time and sensing margin at a low temperature.

As described above, with the enhanced sense amplifier enabling circuit and the semiconductor memory device having the same according to an exemplary embodiment of the present invention, the sensing time can be increased in a semiconductor memory device in which the current driving capability of a transistor constituting a memory cell is degraded as the temperature decreases.

In addition, the length of the sensing time can increased by adjusting the delay at the sense amplifier enable signal according to the temperature when a memory cell is formed on an SOI and a sense amplifier enabling circuit is formed on a bulk silicon layer.

In addition, the enable time point in the sense amplifier can be smoothly adjusted, and the chance of an operation failure in the semiconductor memory device can be reduced by reducing the occurrence of a sensing failure at the sense amplifier.

The invention has been described using exemplary embodiments, however, it is to be understood that the scope of the invention is not limited to the disclosed embodiments. On the contrary, the scope of the invention is intended to include various modifications and alternative arrangements within the capabilities of persons skilled in the art using presently known or future technologies and equivalents.

What is claimed is:

1. A circuit for enabling a sense amplifier in a semiconductor memory device, the circuit comprising:
    a delay unit receiving a sense amplifier enable signal for outputting a sense amplifier enable delay signal after variably delaying the sense amplifier enable signal in response to a delay control signal; and
    a delay control unit for controlling intensity of the delay control signal fed to the delay unit by receiving a reference signal having a temperature reduction dependent characteristic.

2. The circuit according to claim 1, wherein the semiconductor memory device is a stack type semiconductor memory device.

3. The circuit according to claim 1, wherein the temperature reduction dependent characteristic is a characteristic that a voltage level of the reference signal decreases as a temperature decreases.

4. The circuit according to claim 1, wherein the delay unit comprises:
    a PMOS transistor connected between a first power voltage terminal and an output terminal of the delay unit, and having a gate receiving the sense amplifier enable signal; and
    at least one unit inverter connected between the output terminal of the delay unit and the delay control unit and including an NMOS transistor sharing the gate of the PMOS transistor.

5. The circuit according to claim 4, wherein the delay control unit is connected between a source of the NMOS transistor in the at least one unit inverter and ground and includes a control transistor having a gate receiving a reference signal.

6. The circuit according to claim 5, wherein the control transistor is an NMOS transistor.

7. The circuit according to claim 1, further comprising a reference signal generating unit for generating the reference signal fed to the delay control unit.

8. The circuit according to claim 7, wherein the reference signal generating unit comprises:
- a default voltage setting unit for providing the reference signal to an output terminal of the reference signal generating unit when an external power voltage is greater than a first power voltage;
- a reference signal adjusting unit for adjusting the reference signal in consideration of a delay element caused by a process change; and
- a low voltage setting unit for providing the reference signal having a certain level to the output terminal of the reference signal generating unit when the external power voltage is smaller than the first power voltage.

9. The circuit according to claim 8, wherein the default voltage setting unit comprises:
- a first PMOS transistor connected between a first power voltage terminal and the output terminal of the reference signal generating unit; and
- at least one NMOS transistor connected in series between the output terminal of the reference signal generating unit and ground and having a common gate receiving the first power voltage.

10. The circuit according to claim 9, wherein the reference signal adjusting unit comprises a voltage distributing circuit controlled by a bypass signal dependent on a result of a testing delay caused by a process change, and enabling a second power voltage to be distributed and applied to a substrate of the first PMOS transistor.

11. The circuit according to claim 8, wherein the low voltage setting unit comprises:
- a second PMOS transistor connected between the first power voltage terminal and the output terminal of the reference signal generating unit; and
- a comparator for comparing a first input signal to a second input signal and outputting a signal to the gate of the second PMOS transistor in order to turn the second PMOS transistor on or off.

12. The circuit according to claim 11, wherein the comparator outputs a signal for turning the second PMOS transistor on when the external power voltage is smaller than the first power voltage, and outputs a signal for turning the second PMOS transistor off when the external power voltage is greater than the first power voltage.

13. A circuit for enabling a sense amplifier in a semiconductor memory device, the circuit comprising:
- a delay unit for receiving a sense amplifier enable signal for outputting a sense amplifier enable delay signal after variably delaying the sense amplifier enable signal in response to a delay control signal;
- a reference signal generating unit for generating a reference signal having a temperature reduction dependent characteristic; and
- a delay control unit for controlling an intensity of the delay control signal fed to the delay unit by receiving the reference signal.

14. The circuit according to claim 13, wherein the reference signal generating unit comprises:
- a default voltage setting unit for providing the reference signal to an output terminal of the reference signal generating unit when an external power voltage is greater than a first power voltage;
- a reference signal adjusting unit for adjusting the reference signal in consideration of a delay element caused by a process change; and
- a low voltage setting unit for providing a reference signal having a certain level to the output terminal of the reference signal generating unit when the external power voltage is smaller than the first power voltage.

15. The circuit according to claim 14, wherein the delay control unit comprises at least one control transistor connected between a source of an NMOS transistor in the delay unit and ground and having a gate receiving the reference signal.

16. The circuit according to claim 14, wherein the default voltage setting unit comprises:
- a first PMOS transistor connected between a first power voltage terminal and the output terminal of the reference signal generating unit; and
- at least one NMOS transistor connected in series between the output terminal of the reference signal generating unit and ground and having a common gate receiving the first power voltage.

17. The circuit according to claim 16, wherein th reference signal adjusting unit comprises a voltage distributing circuit controlled by a bypass signal dependent on a result of testing delay caused by process change, and enabling an external power voltage to be distributed and applied to a substrate of the first PMOS transistor.

18. The circuit according to claim 17, wherein the low voltage setting unit comprises:
- a second PMOS transistor connected between the first power voltage terminal and the output terminal of the reference signal generating unit; and
- a comparator for comparing a first input signal to a second input signal and outputting a signal to the gate of the second PMOS transistor in order to turn the second PMOS transistor on or off.

19. A semiconductor memory device of a stack type, comprising:
- a sense amplifier for sensing and amplifying data on a bit line; and
- a sense amplifier enabling circuit for generating a sense amplifier enable delay signal for enabling the sense amplifier by receiving a reference signal having a temperature reduction dependent characteristic and including a delay control unit for controlling an intensity of a delay control signal that variably delays the sense amplifier enable signal by receiving the reference signal.

20. The device according to claim 19, wherein the sense amplifier enabling circuit further comprises:
- a delay unit receiving a sense amplifier enable signal for outputting a sense amplifier enable delay signal after delaying the sense amplifier enable signal in response to the delay control signal; and
- a reference signal generating unit for generating the reference signal.

* * * * *